United States Patent [19]

Pesak, Jr.

[11] 3,893,161

[45] July 1, 1975

[54] FRICTIONALLY ENGAGEABLE HEAT SINK FOR SOLID STATE DEVICES

[76] Inventor: Albert Pesak, Jr., c/o Fab-Tek, Inc., 17 Sugar Hollow Rd., Danbury, Conn. 06810

[22] Filed: Feb. 4, 1974

[21] Appl. No.: 439,371

[52] U.S. Cl. ...................... 357/81; 174/15; 165/80; 165/105

[51] Int. Cl. ............................ H01l 3/00; H01l 5/00

[58] Field of Search .................. 317/234 A; 174/15; 165/105, 80

[56] References Cited

UNITED STATES PATENTS

| | | | |
|---|---|---|---|
| 3,047,648 | 7/1962 | Mowatt | 317/234 A |
| 3,407,868 | 10/1968 | Coe | 317/234 A |
| 3,548,927 | 12/1970 | Spurling | 317/234 A |
| 3,572,428 | 3/1971 | Monaco | 317/234 A |
| 3,670,215 | 6/1972 | Wilkens et al | 317/234 P |

*Primary Examiner*—Andrew J. James

*Attorney, Agent, or Firm*—Joseph Levinson, Esq.

[57] ABSTRACT

A heat sink for solid state devices is provided to frictionally engage either a solid state device having a heat conductive tab extending therefrom or a solid state device of the type having a cylindrical body. The heat sink is formed from a stamped sheet metal body of high thermal conductivity which has a first pair of oppositely facing sides bent in from opposite ends of the base member, and a second pair of sides bent in and extending toward each other from the first pair of oppositely facing sides which are terminated in a pair of opposed resilient fingers bent in from the second pair of sides and extending toward the base member. The tab of the solid state device is inserted under the resilient fingers, whereby the fingers and the base member engage the tab, thereby providing good thermal contact between the fingers, the base member, and the tab, to facilitate cooling of the solid state device. In another form the resilient fingers of the heat sink are provided with an opposed arcuate shape with an arcuate groove therein which is adapted to receive and hold in frictional engagement therein a solid state device of cylindrical configuration with a portion of the fingers frictionally contacting the case.

5 Claims, 7 Drawing Figures

FRICTIONALLY ENGAGEABLE HEAT SINK FOR SOLID STATE DEVICES

BACKGROUND OF THE INVENTION

This invention relates to a heat sink for the removal and dissipation of heat generated by a solid state device, and more particularly to a press-on heat sink for solid state devices such as transistors, SCR's, thyristors, etc. of the type having either a heat-conducting tab extending therefrom or a cylindrically shaped metallic casing.

Although a number of solid state devices such as semiconductors in the form of transistors, diodes, etc. are useful because of their small size and small power requirements, nevertheless they generate heat which may either affect their performance or in some cases destroy the devices, thus requiring the devices to be cooled or in some way to remove and dissipate the heat therefrom. The present tendency to further and further compact the circuits and the devices, requiring a large number of elements to be mounted within a small space, compounds the heat removal problem. Numerous methods have been employed by the prior art to attack this problem, usually requiring a different type of device for each different type of solid state device being cooled. Generally these devices are bulky, expensive, require excessive space, or are difficult to manufacture and utilize. For example, with semiconductors of the type having a metallic heat dissipating tab extending therefrom, the heat sink is commonly attached to the device by employing a screw and nut combination through a hole in the tab and bolting the tab to the heat sink. The tab might also be soldered to the heat sink, or in one form shown in the prior art, clipped to both the body of the heat sink and the tab and mounted in the circuit board in which the semiconductor device is to be used for providing stability for the device. All of these means of heat sinking the solid state device require extra holes to be drilled in the chassis or circuit board, require extra mounting steps, and/or require expensive heat sink structures which are bulky and interfere with the placement of other components on a circuit board.

Other types of heat sinks are designed for engaging the outer surface of a semiconductor having a cylindrical housing of heat-conducting material. Some heat sinks of this type are complex, bulky, and/or expensive, and some are suited for use only with a specific type of solid state device.

SUMMARY OF THE INVENTION

Accordingly, it is an object of this invention to provide a new and improved heat sink for solid state devices which is inexpensive, easy to install, and provides a relatively large surface area in a small volume of space.

Another object of this invention is to provide a new and improved heat sink for solid state devices such as semiconductors having a heat-dissipating tab extending therefrom which is easily installed in the heat sink by merely pushing it on with the fingers or with a simple, inexpensive plier-type insertion tool, and having it securely fastened to the heat sink with such a procedure.

Another object of this invention is to provide a new and improved heat sink for solid state devices which may accommodate more than one type of solid state device.

Still a further object of this invention is to provide a new and improved heat sink which is mounted on the tab of a semiconductor device, leaving the space below the heat sink available for the mounting of other components on a circuit board.

In carrying out this invention in one illustrative embodiment thereof, a heat sink is provided comprising a stamped sheet metal body of high thermal conductivity material, having a base member in which a pair of oppositely facing sides are bent therefrom. A second pair of sides are bend in and extend toward each other from the first pair of sides, and the second pair of sides are terminated in opposed resilient fingers bent in from the second pair of sides and extending to the base member. The tab of a semiconductor device is inserted under the resilient fingers which frictionally engage the tab and hold the tab between the fingers and the base member. In one form, the fingers may be of opposed arcuate shape having arcuate slots therein which are adapted to receive a cylindrically shaped case of another type of semiconductor device.

DESCRIPTION OF THE PREFERRED EMBODIMENTS

Figures 1, 3:
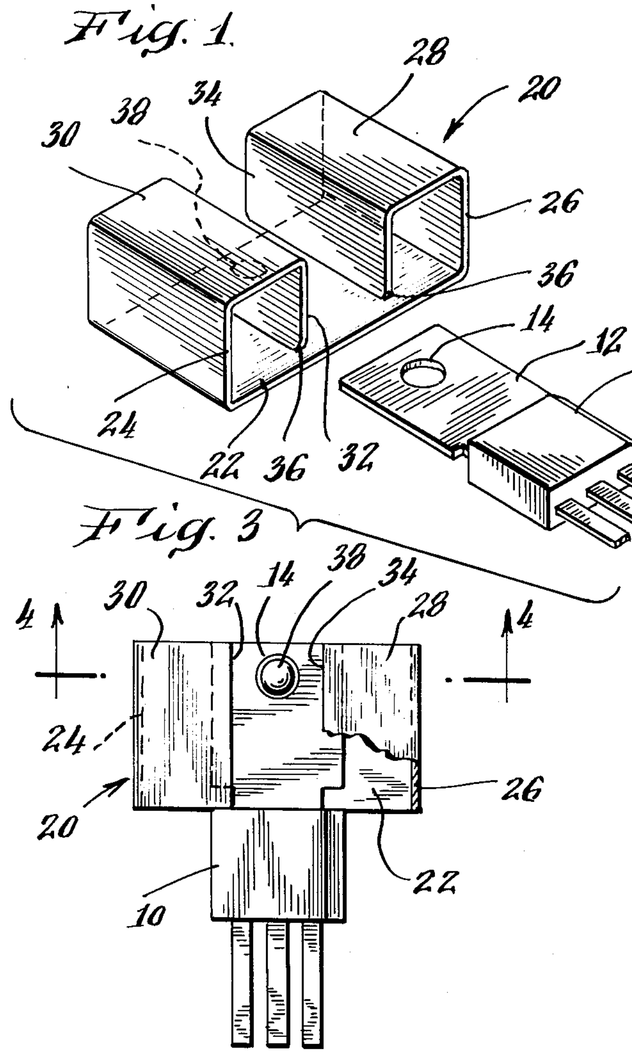
FIG. 1 is an exploded isometric view of one form of heat sink embodied in this invention illustrating the type of solid state device with which it is to be utilized.
FIG. 3 is a front elevation view of FIG. 1 showing the semiconductor device of FIG. 1 mounted in the heat sink.
Figure 4:
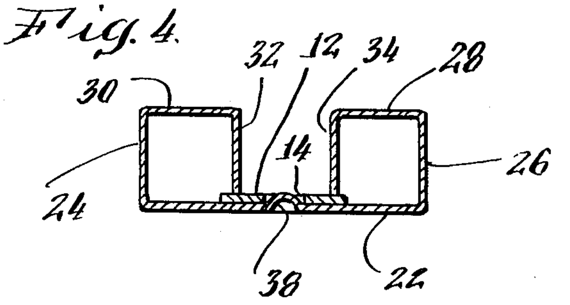
FIG. 4 is a cross-sectional view along lines 4—4 of FIG. 3.

Referring now to FIGS. 1, 3, and 4, a heat sink 20 is provided for accommodating a solid state device 10 of the type having a tab 12 of heat-conducting material extending therefrom with an opening 14 therein. The heat sink 20 is made from a stamped sheet metal body of high thermal conductivity material such as aluminum or copper, and has a base member 22 thereon. A first pair of oppositely facing sides 24 and 26 are bent in from opposite ends of the base member 22. A second pair of sides 30 and 28 are bent in and extend toward each other from said first pair of oppositely facing sides 24 and 26 respectively, and are spaced from said base member 22. A pair of opposed resilient fingers 34 and 32 are bent in from the second pair of sides 28 and 30 respectively, and extend to the base member 22. A detent means 38 in the form of a dimple on the under side of base member 22, as is best seen in FIG. 4, is provided between the resilient fingers 32 and 34 on the base member 22. The edges of the resilient fingers 32 and 34 furthest removed from the detent means 38 are rounded at 36 to provide a means for the ready insertion of the tab 12 of the solid state device 10 into the heat sink 20. The heat sink 20 so formed has rectangular box-like members formed on opposite sides of the base member 22 to provide a relatively large surface area in a small volume of space.

The solid state device in the form of semiconductor 10 is mounted on the heat sink 20 by inserting the tab 12 of the semiconductor 10 under the rounded areas 36 of resilient fingers 32 and 34 and pressed on the heat sink 20. The tab 12 moves along base member 22 until the hole 14 in tab 12 registers with the detent means 38, which registers with the hole 14 and retains the tab and the semiconductor 10 in the heat sink 20. The tab 12 is retained in the heat sink by frictional engagement between the ends of the resilient fingers 32 and 34 and the top surface of base member 22 which engage the upper and lower surface of the tab 12 respectively. The heat from the semiconductor 10 is then effectively conducted from both sides of semiconductor tab 12 through the ends of the resilient fingers 32 and 34 and the upper surface of the base member 22 of the heat sink, to dissipate the heat from the semiconductor 10 rapidly. The detent means 38 in cooperation with the hole 14 in the tab 12 of the semiconductor 10 insures that the position of the tab will be retained in the heat sink 20, which permits the handling of the mounted semiconductor without the danger of disengaging the frictional mount previously described. It will be seen from FIG. 3 that when the semiconductor 10 is mounted on a circuit board, the body of the semiconductor device will be positioned between the circuit board and the heat sink 20, allowing other components and parts to be mounted on the circuit board under or around the heat sink 20 without interference from the heat sink. In other words, the heat sink 20 does not interfere with the positioning of other elements which are to be utilized with the semiconductor 10 on a common substrate or circuit board. The mounting of the semiconductor 10 on the heat sink 20 requires no screw-and-nut assembly, soldering, no circuit board space or chassis space, or mounting holes in a circuit board or chassis.

Figure 2:
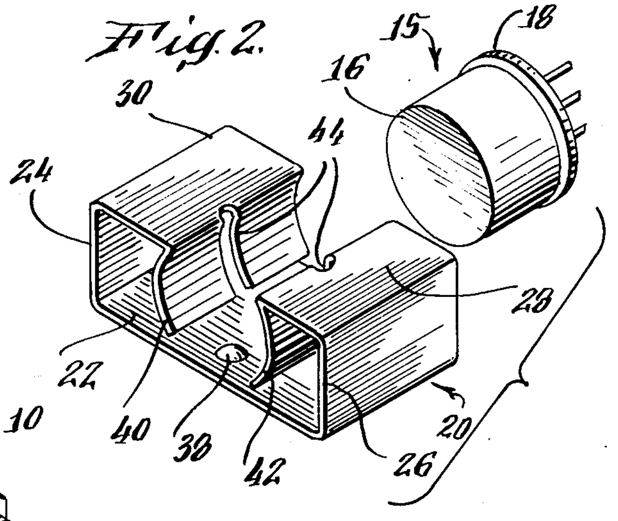
FIG. 2 is an exploded isometric view of another embodiment of the heat sink shown in FIG. 1 utilizing a different type of solid state device.
Figure 5:
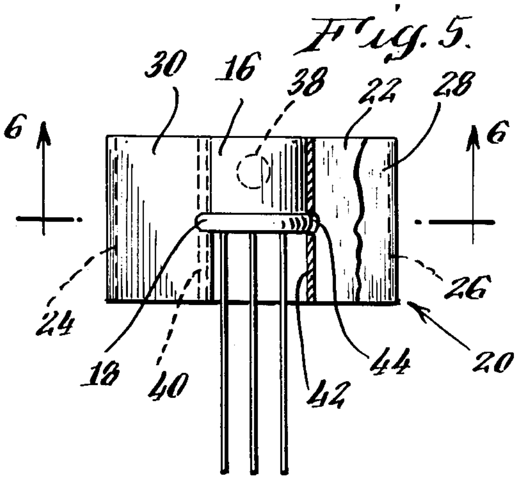
FIG. 5 is a front elevational view of the heat sink shown in FIG. 2 with the semiconductor device mounted therein.
Figure 6:
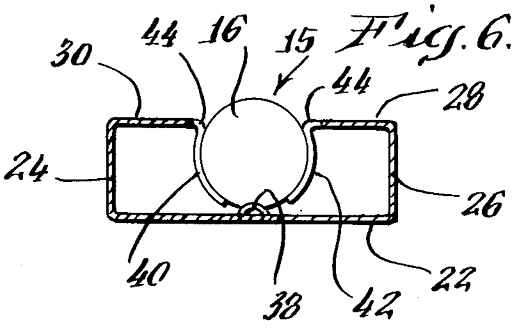
FIG. 6 is a cross-sectional view taken along lines 6—6 of FIG. 5.

FIGS. 2, 5, and 6 show a modification of the heat sink 20 shown in FIG. 1, and like parts will contain like reference numerals. In the embodiment of FIG. 2, the resilient fingers, now identified as 40 and 42, have an opposed arcuate configuration with an annular groove 44 in each. This structure is utilized to accommodate a solid state device such as a transistor 15 having a cylindrical body 16 mounted on a rim-like base in which the rim 18 has a larger diameter than the diameter of the cylindrical body 16. As will be seen in FIGS. 5 and 6, the transistor 15 is mounted on the heat sink 20 by pressing the rim 18 in the annular grooves 44 of the resilient fingers 40 and 42. The transistor so mounted is snapped in between the resilient fingers 40 and 42 with the upper portion of the fingers 40 and 42 bearing upon the cylindrical case 16 of the transistor 15 to hold it in frictional engagement therewith and to retain the transistor 15 in the heat sink 20. The lower portion of the fingers 40 and 42 also bear on the under side of the rim 18, and the rim also contacts the base member 22 to provide further heat conductive paths for cooling the transistor 15. The detent means 38 may also bear on the cylindrical case 16 to further provide a heat conducting path from the transistor to the heat sink 20.

Figure 7:
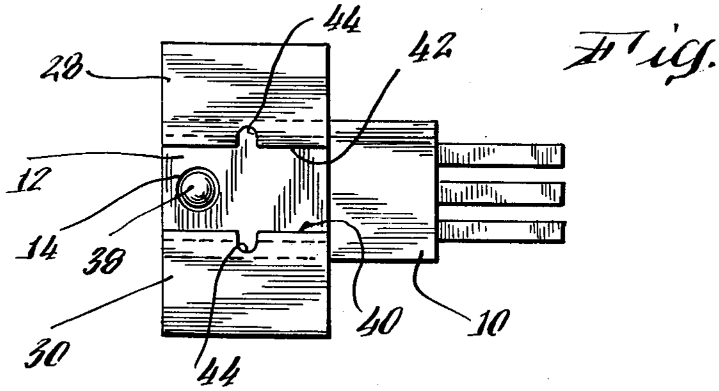
FIG. 7 is a top view of the heat sink shown in FIG. 2 having a semiconductor device of the type shown in FIG. 1 mounted therein.

As will be seen in FIG. 7, a solid state device such as semiconductor 10 as shown in FIG. 1 may be mounted in the heat sink shown in FIG. 2 by inserting the tab 12 under the resilient fingers 40 and 42 and retaining it thereunder by the resiliency of the fingers as well as the detent means 38. Accordingly, the heat sink as modified in FIG. 2 may accommodate different types of solid state devices, providing more flexibility and requiring fewer types of heat sinks in inventory for the various types of semiconductor devices to be cooled.

It will be apparent that various shapes and sizes of semiconductor devices can be accommodated by the heat sink embodied in this invention. The heat sink of the invention may be utilized for semiconductors of the type having heat-conductive tabs thereon, such as GE model C106 type thyristors, and similar flat pastic-packaged semiconductors as shown in FIG. 1. The modification as shown in FIG. 2 is adapted to receive cylindrical metallic body cases having annular base rims, for example of the TO-5 package type, or those of similar construction. Different sizes may be accommodated by changing the size or arcuate configuration of the heat sink.

Since other modifications and changes varied to fit particular operating requirements and environments will be apparent to those skilled in the art, this invention is not considered limited to the examples chosen for purposes of disclosure, and covers all changes and modifications which do not constitute departures from the true spirit and scope of this invention.

I claim:

1. A heat sink adapted to frictionally engage a solid state device of the type having a metallic tab extending therefrom which is inserted therein for the removal and dissipation of heat generated by such a device, comprising a. a stamped sheet metal body of high thermal conductivity material having a base member,
b. a first pair of oppositely facing sides bent in from opposite ends of said base member,
c. a second pair of sides bent in and extending toward each other from said first pair of oppositely facing sides and spaced from said base member, and
d. a pair of opposed resilient fingers bent in from said second pair of sides and extending to said base member,
e. said first and second pairs of sides and said pair of opposed resilient fingers forming open ended enclosures on each end of said base member,
f. said base member and said resilient fingers adapted to receive and frictionally engage the metallic tab of a solid state device inserted therein, said heat sink being positioned vertically on the metallic tab of the solid state device with said open ended enclosures vertically aligned with the solid state device on which said heat sink is mounted, thereby accommodating the air flow through the hollow enclosures of the heat sink and facilitating the cooling of the solid state device.

2. The heat sink set forth in claim 1 having a detent means in said base member positioned between said fingers adapted to engage a hole in the metallic tab of a solid state device inserted therein for locking the metallic solid state device on said base member under said fingers.

3. The heat sink set forth in claim 2 wherein the bottom edges of said fingers spaced the greatest distance from said detent means are rounded to facilitate the insertion of the metallic tab of a solid state device thereunder.

4. A heat sink adapted to frictionally engage a solid state device of the type having a metallic cylindrical case with a circular flange thereon which is inserted and held in said heat sink for the removal and dissipation of heat generated by such a device, comprising a. a stamped sheet metal body of high thermal conductivity material having a base member,
b. a first pair of oppositely facing sides bent in from opposite ends of said base member,
c. a second pair of sides bent in and extending toward each other from said first pair of oppositely facing sides and spaced from said base member, and
d. a pair of opposed resilient fingers bent in from said second pair of sides and extending to said base member, said opposed fingers each having an opposed arcuate shape with an arcuate groove therein,
e. said first and second pairs of sides and said pair of opposed resilient fingers forming open ended enclosures on each end of said base member,
f. said base member and said resilient fingers with said arcuate grooves therein adapted to receive and frictionally engage the metallic cylindrical case and circular flange of the solid state device inserted therein with the circular flange thereon positioned in the arcuate grooves of said resilient fingers, said heat sink being positioned vertically on the cylindrical case of the solid state device with said open ended enclosures vertically aligned with the solid state device on which said heat sink is mounted, thereby accommodating the air flow through the hollow enclosures of the heat sink and facilitating the cooling of the solid state device.

5. A heat sink adapted to frictionally engage a solid state device of the type having a heat conductive metallic tab extending therefrom or of the type having a metallic cylindrical case with a circular flange either of which may be inserted in said heat sink for the removal and dissipation of heat generated by such a device, comprising a. a stamped sheet metal body of high thermal conductivity material having a bse member,
b. a first pair of oppositely facing sides bent in from opposite ends of said base member,
c. a second pair of sides bent in and extending toward each other from said first pair of oppositely facing sides and spaced from said base member, and
d. a pair of opposed arcuately shaped resilient fingers bent inward from said second pair of sides and extending toward and terminating in close proximity to said base member, said arcuately shaped resilient fingers having symmetrically opposed arcuate slots therein,
e. said first and second pairs of sides and said pair of opposed resilient fingers forming open ended enclosures on each end of said base member,
f. said resilient fingers adapted to receive and frictionally engage either a solid state device of the type having a heat conductive metallic tab thereon whereby the tab is inserted and held between said resilient fingers and said base member, or a solid state device of the type having a metallic cylindrical case with a circular flange thereon, said fingers frictionally engaging the cylindrical case of the solid state device and said opposite arcuate slots receiving and holding the circular flange of the solid state device.

* * * * *